Jan. 9, 1973 J. W. HALL II 3,709,729

METHOD OF MAKING NICKEL-CHROME OHMIC CONTACT
TO P-TYPE SILICONE CARBIDE

Original Filed July 22, 1969

Inventor:
John W. Hall, II
by Ernest W. Legree
His Attorney

United States Patent Office 3,709,729
Patented Jan. 9, 1973

3,709,729
METHOD OF MAKING NICKEL-CHROME OHMIC CONTACT TO P-TYPE SILICON CARBIDE

John W. Hall II, Mentor, Ohio, assignor to General Electric Company, Schenectady, N.Y.

Original application July 22, 1969, Ser. No. 843,313. Divided and this application Jan. 20, 1971, Ser. No. 108,217
Int. Cl. B44d 1/18
U.S. Cl. 117—227 4 Claims

ABSTRACT OF THE DISCLOSURE

Ohmic contact is made to p-type silicon carbide by depositing a film of nickel, chromium or nickel-chrome thereon while heating the silicon carbide at a temperature of about 600° to 800° C.

CROSS-REFERENCES TO RELATED APPLICATIONS

This is a division of application Ser. No. 843,313, filed July 22, 1969, now abandoned.

Pat. No. 3,458,779, issued July 29, 1969, John M. Blank and Ralph M. Potter, entitled "SiC P-N Junction Electroluminescent Diode With a Donor Concentration Diminishing From the Junction to One Surface and an Acceptor Concentration Increasing in the Same Region" and similarly assigned.

Pat. No. 3,510,733, issued May 5, 1970, Arrigo Addamiano, entitled "Semiconductor Crystals of Silicon Carbide With Improved Chromium-Containing Electrical Contacts" and similarly assigned.

Copending application Ser. No. 841,342, filed July 14, 1969 of John W. Hall II and William E. Tragert, now Pat. No. 3,611,064, issued Oct. 5, 1971, entitled "Ohmic Contacts to Silicon Carbide" and similarly assigned.

BACKGROUND OF THE INVENTION

The invention relates to light-emitting diodes or solid state lamps of silicon carbide which comprise a crystal chip containing a p-n junction. The n-type region of the chip may be nitrogen doped and the p-type region may be boron and/or aluminum doped. It is necessary to provide contacts to both sides of the semiconductor chip which are ohmic, that is nonrectifying, as low in resistance as possible, and which do not deleteriously affect emission of light by the junction. For a practical device it is also necessary that the chip be mounted securely on a header or base disc.

In one heretofore commercially available silicon carbide solid state lamp, the SiC chip is provided with a p-side ohmic contact by means of a thin film of evaporated aluminum and it is soldered p-side down on the header. Light is emitted through the upper n-side to which a small dot contact is made by a gold-tantalum alloy which is fired on. Connection to the n-side dot contact is made by thermo-compression bonding.

Although the foregoing structure has been found adequate for commercial production of solid state silicon carbide lamps, contacts which are more reliable and which have a lower contact resistance are desirable. The above-referenced Addamiano patent describes a method making a nickel-chrome rectifying contact to p-type silicon carbide.

SUMMARY OF THE INVENTION

In accordance with the invention, a low resistance ohmic contact to p-type SiC comprises a vacuum-evaporated thin film of nickel-chrome having a thickness preferably ranging from 500 to 5000 A. The film is laid down by evaporating a piece of Nichrome strip or wire in a vacuum in proximity to a single crystal or platelet of silicon carbide which has its p-side or face exposed to the vapors. The platelet is heated to a temperature in the range of 600 to 800° C. while the vacuum deposition takes place. At that temperature there is not appreciable solution of nickel or chrome into the silicon carbide to affect the type of conductivity, but there is sufficient surface action to obtain strong adherence and a low resistance ohmic or nonrectifying contact. A piece or chip of the platelet is mounted p-side down on a header or base disc and soldered or brazed in place to make a solid state lamp.

FIGS. *4a* and *b* illustrate a silicon carbide light-emitting diode or lamp.

DESCRIPTION OF THE PREFERRED EMBODIMENTS

Figures 1, 2, 3:
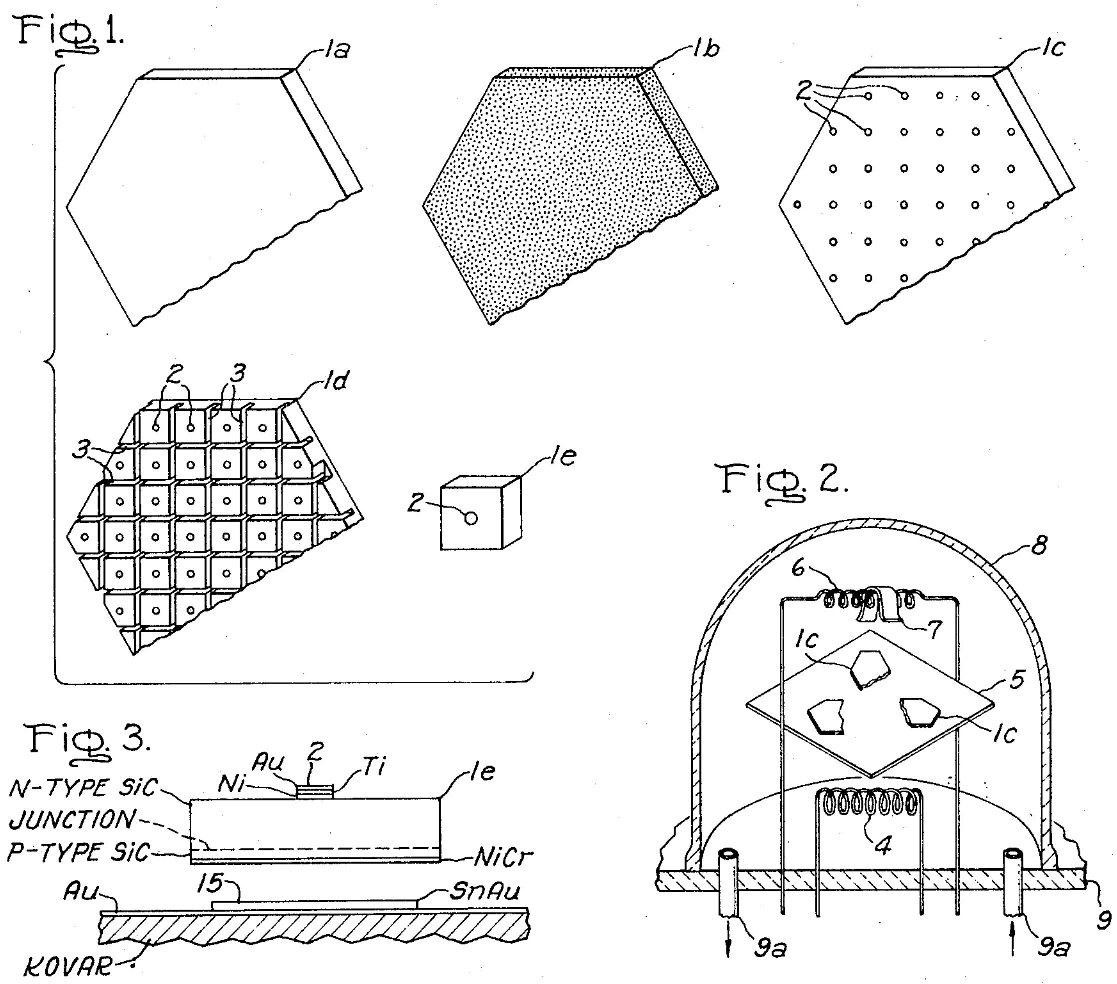
FIG. 1 illustrates successive stages in the processing of a silicon carbide platelet to a light-emitting crystal chip ready for mounting on a header.
FIG. 2 illustrates apparatus for vacuum evaporating a nickel-chrome thin film onto silicon carbide platelets.
FIG. 3 illustrates schematically the various layers present in an SiC chip ready for mounting on a header.

A single crystal or platelet of green nitrogen-doped alpha SiC which has been ground and polished to plane surfaces perpendicular to the C axis is shown at 1*a* in FIG. 1. Boron and aluminum may be diffused into the crystal, preferably in the manner described in the aforementioned Blank and Potter application, in order to make a junction. Diffusion creates a p-type surface layer, typically 0.1 to 10 microns thick, on both faces of the platelet, as shown at 1*b* by light stippling. The p-type layer is then ground off on one side of the crystal to expose the original n-type bulk material. Typically, grinding may reduce the thickness of the crystal or wafer to about 0.010–0.015″.

In subsequent processing, the platelet is diced, that is, divided into square dice or chips approximately 1 mm. x 1 mm. in size, and each such chip is mounted on a header to make a solid state lamp. Each chip requires an ohmic contact to the p-side which may extend over the entire area of the p-side, and an ohmic contact to the n-side which should be small in order to obstruct a minimum of the light emitted through the n-side. The small area dot contacts 2 on the n-side are shown at stage 1*c* of the platelet, and they are laid out in a pattern corresponding to the dice into which the platelet will be cut. At stage 1*d*, the platelet or wafer is shown partially cut through or scored on the exposed n-side along lines 3 which place the dot contacts 2 about in the center of the dice. A single die or chip which has been broken off from the platelet is shown at 1*e*.

To make the small area ohmic contacts to the n-side, the platelet may be placed on a mask containing small holes in the order of 0.005″ diameter in an evenly spaced array corresponding to the center to center distance of the chips into which the platelet will eventually be cut or diced. A typical spacing between holes in the mask is 40 to 50 mils to produce 1 mm. square chips. The mask is arranged to hold the SiC platelets over tungsten evaporator coils suitable for evaporating nickel, titanium and gold within a vacuum chamber. The temperature of the silicon carbide chip during the deposition is barely above the ambient, for instance 30° C., and the three films are deposited in sequence without breaking vacuum. By way of example, the film thicknesses may be as follows:

| | A. |
|---|---|
| Nickel | 1000–2000 |
| Titanium | 200–500 |
| Gold | 5000–10,000 |

The dot contact 2 with superposed films of Ni, Ti and Au greatly exaggerated in thickness is shown in FIG. 3.

After the contact system is deposited, the silicon carbide platelet is fired in an inert atmosphere such as argon at 1200–1500° C. for a few seconds and there results a low resistance ohmic contact to n-type silicon carbide having a donor concentration as low as $1\times10^{18}$ donors/cc. The concentration of gold in the top layer permits thermocompression bonding of a fine gold wire thereto, and the titanium layer intervening between the nickel and gold layers prevents agglomeration of the gold. For a more detailed description of the method of making the dot contacts to the n-side, reference is made to the aforementioned Hall and Tragert application.

After the n-side dot contacts have been made, the crystals or platelets 1*c* are placed p-side up on a plate whereon they may be heated to the range of 600 to 800° C. As illustrated in FIG. 2, plate 5 may be of stainless steel and is located over a resistance heater coil 4. In an alternative arrangement, the crystals are placed p-side up on a graphite resistance heater. A tungsten evaporator coil 6 has a small strip 7 of nickel-chrome alloy wrapped around it. A bell jar 8 is lowered over the whole and seals to a base 9. The base has apertures 9*a* through which vacuum is pulled down to at least $10^{-6}$ torr, preferably $10^{-7}$ torr.

The film of Ni-Cr laid down on the SiC platelet should be at least 500 A. thick; for best results, a thickness from 1000 to 5000 A. is preferable. Film thicknesses up to 10,000 A. were investigated and found acceptable. A thin film is desirable, that is, one wherein the means free path of the electron approaches the thickness of the film so that the resistivity in the film is different from the bulk resistivity. In general, 10,000 A. (1 micron) is considered the upper limit for thin films. Of course eventually cracking and crazing due to the different rates of thermal expansion of the film and the underlying substrate crystal set a limit to film thickness.

The temperature of 600 to 800° C. at which the crystal is held during film deposition is important. High temperature sufficient to cause nickel or chromium to dissolve into the silicon carbide must be avoided because a rectifying contact then results. Without heating, adherence is inadequate and the contact resistance too high. Within the stated temperature range, there is sufficient surface action to obtain strong adherence and a low resistance ohmic contact.

The film may be of nickel or chrome or any proportion of nickel to chrome which is ductile. For best results, a proportion of 70% or more Ni with the balance Cr has been found desirable and the preferred proportion is 80% Ni, 20% Cr.

After deposition of the contact films, the wafer is partially cut through or scored equi-distantly between the lines of dot contacts as shown at 1*d* in FIG. 1 in order to form square disc or chips approximately 1 mm. x 1 mm. in size. At this point, the scored platelet is sometimes referred to as a dotted raft. The raft is next broken along the score lines into dice or chips as shown at 1*e*.

Figure 4A:
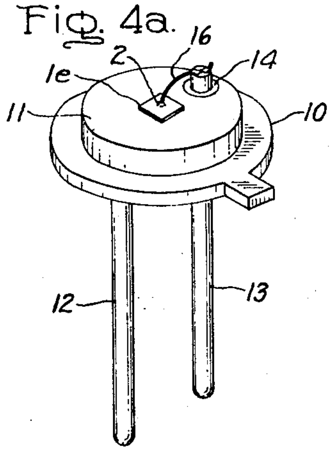

To make a solid state lamp, a single chip is mounted on a transistor type header 10 shown in FIG. 4*a*. The header comprises a gold-plated base disc 11 of Kovar which is a nickel-cobalt-iron alloy having a coefficient of expansion substantially matching that of silicon carbide. Ground lead wire 12 is attached to the underside of the base disc, and another lead wire 13 projects through the disc but is insulated therefrom by a sleeve 14. A tin-gold soldering alloy is laid down in a small area on top of the gold-plated header disc 11, as shown at 15 in FIG. 3. This may be done by vacuum evaporation, using a mask to confine the deposition of metal to the desired area. The chip is then placed p-side down on the header as illustrated in FIG. 3, and pressure applied while heating to a temperature sufficient to melt the alloy, suitably 400 to 500° C. in a reducing atmosphere like hydrogen.

Figure 4B:
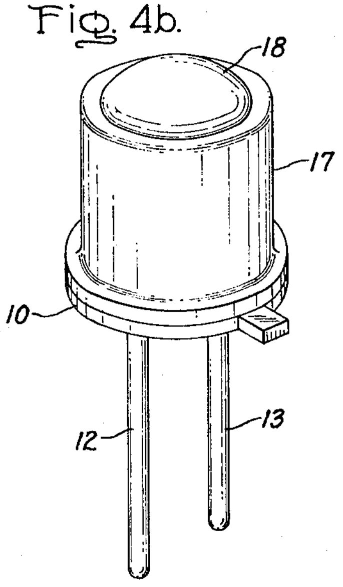

After the chip or die is mounted on the header, a soft metal wire 16, suitably of gold, is bonded by thermocompression bonding to the alloy dot 2 on the top side of the die, bent over laterally, and bonded to the top of lead wire 13 projecting through the disc as shown in FIG. 4*a*. The header may be capped by a metal can or cover 17 equipped with a lens 18 in its end wall as shown in FIG. 4*b*, whereby to enclose and protect the light-emitting crystal chip.

While a preferred embodiment of the invention has been shown and described, other embodiments and modifications thereof will become apparent to persons skilled in the art, and will fall within the scope of invention as defined in the following claims.

What I claim as new and desire to secure by Letters Patent of the United States is:

1. A method of making an ohmic contact to p-type silicon carbide, comprising the steps of depositing onto said silicon carbide a film of nickel, chromium or nickel-chrome thereon while heating said silicon carbide at a temperature of about 600° to 800° C.

2. The method of claim 1, in which said film is deposited to a thickness of about 500 to 5000 A.

3. The method of claim 1, in which said film consists of at least 70% nickel, the balance being chromium.

4. The method of claim 3, in which said film is about 80% nickel and 20% chromium.

References Cited

UNITED STATES PATENTS

| | | | |
|---|---|---|---|
| 3,436,614 | 4/1969 | Nagatsu et al. | 317—234 |
| 3,458,779 | 7/1969 | Blank et al. | 317—234 |
| 2,882,377 | 4/1959 | Rinehart | 117—107 |
| 3,611,064 | 10/1971 | Hall et al. | 317—234 L |

ALFRED L. LEAVITT, Primary Examiner

C. K. WEIFFENBACH, Assistant Examiner

U.S. Cl. X.R.

117—107; 317—234 J, 234 L